(12) United States Patent
Yamano et al.

(10) Patent No.: US 7,498,259 B2
(45) Date of Patent: Mar. 3, 2009

(54) THROUGH ELECTRODE AND METHOD FOR FORMING THE SAME

(75) Inventors: Takaharu Yamano, Nagano (JP); Nobuyuki Kurashima, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 59 days.

(21) Appl. No.: 11/499,947

(22) Filed: Aug. 7, 2006

(65) Prior Publication Data

US 2006/0267210 A1 Nov. 30, 2006

Related U.S. Application Data

(62) Division of application No. 11/167,750, filed on Jun. 27, 2005.

(30) Foreign Application Priority Data

Jun. 29, 2004 (JP) ............... 2004-191488

(51) Int. Cl.
    *H01L 21/44* (2006.01)
(52) U.S. Cl. ............... 438/667; 257/E21.061
(58) Field of Classification Search ........... 438/637, 438/667, 629, 672; 257/276, E21.577, E21.585, 257/E21.061
    See application file for complete search history.

(56) References Cited

U.S. PATENT DOCUMENTS

| 4,374,868 | A | 2/1983 | Stahl et al. |
| 6,039,889 | A | 3/2000 | Zhang et al. |
| 6,268,619 | B1* | 7/2001 | Kosaki et al. ............... 257/276 |
| 2003/0209813 | A1 | 11/2003 | Azuma |
| 2004/0004285 | A1 | 1/2004 | Cheng et al. |
| 2004/0043615 | A1 | 3/2004 | Yamamoto et al. |
| 2004/0104451 | A1* | 6/2004 | Ooi et al. ............... 257/532 |
| 2006/0185141 | A1* | 8/2006 | Mori et al. ............... 29/25.41 |

FOREIGN PATENT DOCUMENTS

| EP | 1 376 686 | 1/2004 |
| JP | 1-258457 | 10/1989 |
| JP | 7-307565 | 11/1995 |
| JP | 8-213543 | 8/1996 |
| JP | 2001-185674 | 7/2001 |

\* cited by examiner

*Primary Examiner*—Thao P. Le
(74) *Attorney, Agent, or Firm*—Ladas & Parry LLP

(57) ABSTRACT

A method for forming a through electrode is disclosed. The through electrode integrally comprises a columnar electrode filling a through hole, a lower end electrode pad formed on a lower end side of a columnar electrode and having an area wider than the cross section of the through hole, and an upper end electrode pad formed on an upper end side of the columnar electrode and having an area wider than the cross section of the through hole. The lower end electrode pad is arranged is arranged to occlude a lower end opening of the through hole. The columnar electrode fills the through hole by laminating copper on the lower end electrode pad.

6 Claims, 22 Drawing Sheets

THROUGH ELECTRODE AND METHOD FOR FORMING THE SAME

CROSS-REFERENCE TO RELATED APPLICATIONS

This application is a divisional of U.S. application Ser. No. 11/167,750 filed Jun 27, 2005.

BACKGROUND OF THE INVENTION

1. Field of the Invention

The present invention relates to a through electrode and a method for forming the same, and particularly relates to a through electrode adapted to fill a small hole with a conductive material and a method for forming the same.

2. Description of the Related Art

Electronic devices having three-dimensional structures, such as micromachine packages and interposers, called as MEMS (Micro Electro Mechanical Systems), and utilizing semiconductor microprocessing technologies are known. In recent years, techniques for forming through electrodes that connect an upper wiring pattern to a lower wiring pattern in such an electronic device have been developed. For example, in some interposers, through electrodes are formed in through holes extending between an upper face and a lower face of a substrate so as to provide electrical connection between wiring patterns (see, for example, Japanese Patent Laid-Open Publication No. 1-258457).

This publication discloses a method for filling through holes, which are formed in a substrate covered with insulating film, with metal by plating. According to this method, a seed layer is formed on an upper face of a substrate by a sputtering method. Then, an electrode for plating is brought into contact with an upper face of the seed layer to deposit conductive metal, such as Cu, onto the surface of the seed layer using an electrolytic plating method. A conductor layer formed of the conductive metal is then grown, so that the through holes are filled with metal.

However, the method described above has a problem that, because the conductor layer formed on the surface of the seed layer is formed on the inner surfaces of the through holes and grows on the inner surfaces of the through holes, voids are formed near the center of the individual through holes along with the growth of the conductor layer.

Especially, in the case of micromachine packages, when the diameter of a through hole relative to the thickness of a substrate is small and accordingly the aspect ratio (thickness/hole diameter) is high, it is difficult to form a through electrode in such a small through hole.

SUMMARY OF THE INVENTION

A general object of the present invention is to provide a through electrode and a method for forming the same to solve at least one problem described above.

According to an aspect of the present invention, there is provided a method for forming a through electrode, comprising a first step of forming a seed layer on a surface of a support body, a second step of forming an adhesive layer on a surface of the seed layer, a third step of pressing a substrate having a through hole formed therein onto the adhesive layer, a fourth step of removing a portion of the adhesive layer that communicates with the through hole of the substrate by a development process to form a clearance wider than a cross section of the through hole at a lower end of the through hole; a fifth step of filling the clearance and the through hole with a conductor to form a lower end electrode pad covering the lower end of the through hole and a columnar electrode filling the through hole; and a sixth step of removing the support body, the seed layer, and the adhesive layer from the substrate.

The fifth step preferably includes a step of forming an Au layer constituting the lower end electrode pad on the surface of the seed layer, a step of forming a Ni layer on a surface of the Au layer, and a step of laminating a Cu layer on a surface of the Ni layer to form the columnar electrode.

It is preferable that an adhesive tape be applied to the surface of the support body, and then the seed layer be formed on an adhesive face of the adhesive layer in the first step; and after the columnar electrode is formed in the fifth step, the support body be separated from the seed layer by heating the adhesive tape in the sixth step.

It is also preferable that the seed layer be formed on the surface of the support body in the first step, and then the adhesive layer be formed on the seed layer; and after the columnar electrode is formed inside the through hole in the fifth step, the support body be separated from the seed layer by heating the adhesive layer in the sixth step.

It is also preferable that the adhesive layer include a photoresist layer; and the fourth step include a step of removing the photoresist layer formed in the area communicating with the through hole of the substrate by a development process, and a step of forming the clearance wider than the cross section of the through hole at the lower end of the through hole.

It is preferable that the method for forming a through electrode further comprise a step of laminating a resist layer on an upper face of the substrate and forming an opening wider than the cross section of the through hole at an upper end of the through hole in the resist layer, a step of filling the opening of the resist layer with a conductor to form an upper end electrode pad continuous to an upper end of the columnar electrode, and a step of removing the resist layer surrounding the upper end electrode pad.

According to another aspect of the present invention, there is provided an electrode that is inserted in a through hole extending through a substrate and electrically connects a conductor pattern formed on an upper face of the substrate to a conductor pattern formed on a lower face of the substrate, comprising a lower end electrode pad wider than a cross section of the through hole and configured to seal a lower end opening of the through hole, and a columnar electrode formed from bottom to top so as to fill the through hole by laminating a conductive material on the lower end electrode pad.

It is preferable that an upper end electrode pad wider than the cross section of the through hole and configured to seal an upper end opening of the through hole be formed on an upper end of the columnar electrode.

According to the present invention, the seed layer is formed on the surface of the support body, and the substrate is mounted on the adhesive layer formed on the surface of the seed layer. There is no need to separately provide an adhesive layer for fixing the substrate, thereby simplifying a production process and lowering production costs. The adhesive layer formed in the area communicating with the through hole of the substrate is removed by development to form a clearance wider than the cross section of the through hole at the lower end of the through hole. Therefore, the lower end electrode pad covering the lower end of the through hole can be formed in the clearance opposing the seed layer. Moreover, because the columnar electrode is formed from bottom to top on the lower end electrode pad, formation of voids near the center of the through hole is prevented. As such, the columnar electrode can be stably formed even if the aspect ratio (thickness/hole diameter) is high.

As the seed layer is formed on the surface of the support body with the adhesive tape interposed therebetween, the support body is easily separable from the seed layer by heating the adhesive tape after forming the through electrode.

Also, as the adhesive layer is formed on the surface of the support body with the seed layer interposed therebetween, the support body is easily separable from the substrate by heating the adhesive layer.

DETAILED DESCRIPTION OF THE PREFERRED EMBODIMENT

The following description provides exemplary embodiments of the present invention with reference to the accompanying drawings.

First Embodiment

Figure 1:
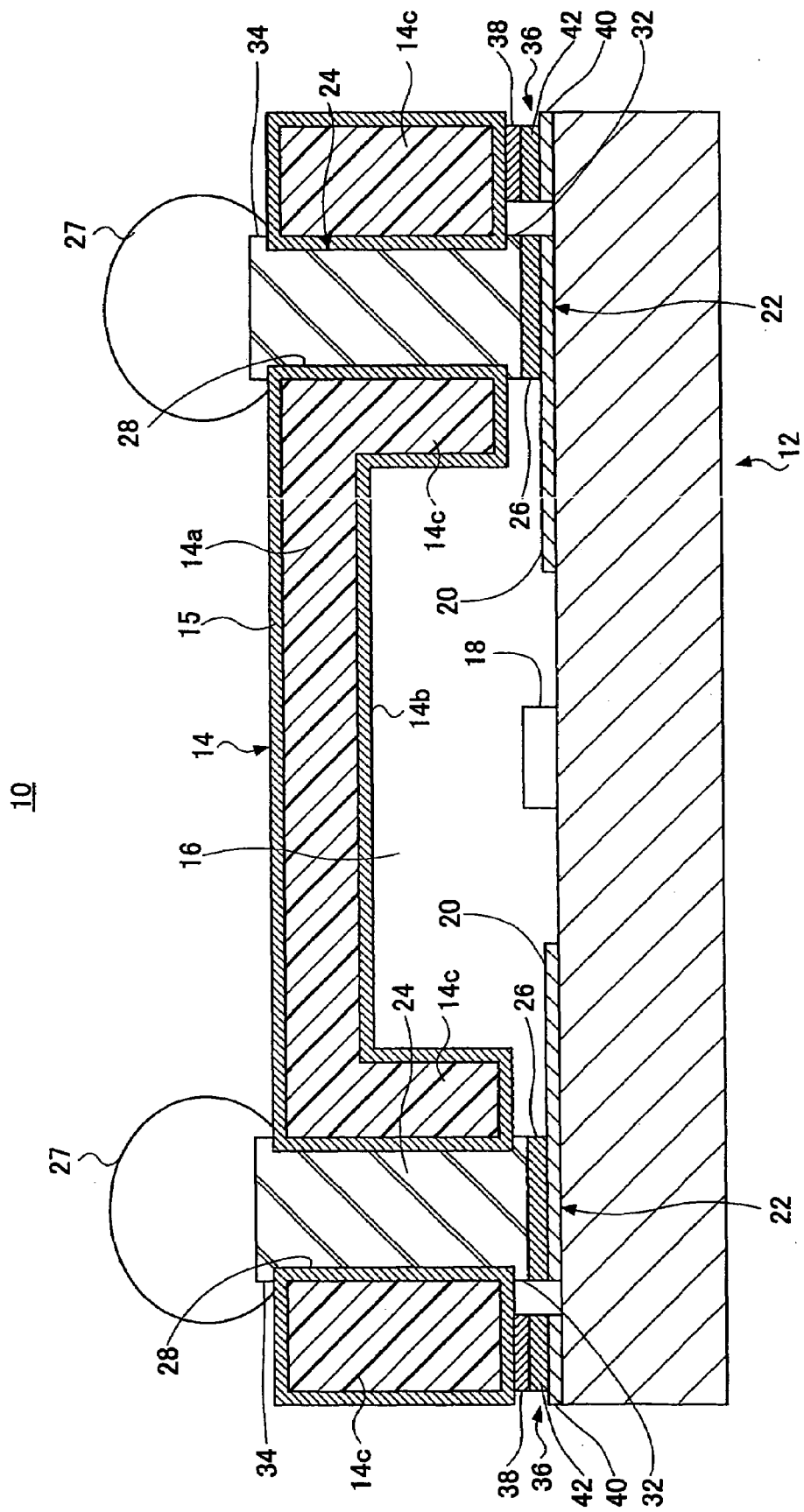
FIG. 1 is a vertical cross-sectional view illustrating an electronic device to which an embedment of a through electrode and a method for forming the same according to the present invention are applied.
Figure 2:
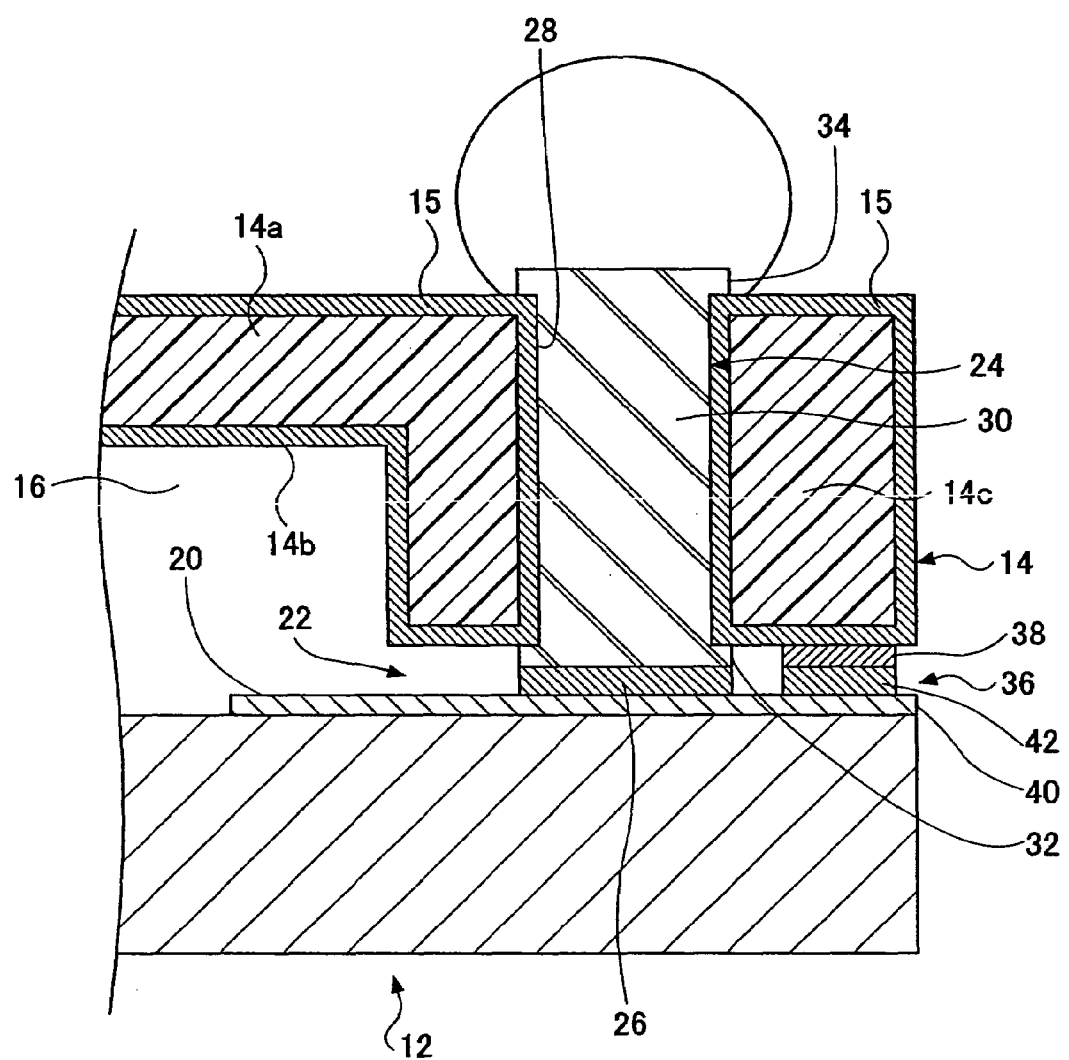
FIG. 2 is an enlarged vertical cross-sectional view illustrating a through electrode.

FIG. 1 is a vertical cross-sectional view illustrating an electronic device 10 to which an embedment of a through electrode and a method for forming the same according to the present invention are applied. FIG. 2 is an enlarged vertical cross-sectional view illustrating the through electrode.

In the electronic device 10, as shown in FIG. 1, a function element 18 serving as a micromachine part is formed in an element mount space 16 defined by a substrate 12 and a lid (substrate) 14. Each of the substrate 12, the lid 14, and the element mount space 16 has a quadrangular shape when viewed from the top. According to this embodiment, the substrate 12 may be, for example, a silicon wafer (silicon substrate) or a glass substrate. If silicon is used as the substrate 12, a silicon wafer or glass is preferable as a support body described below. This embodiment is applicable for forming through electrodes not only in simple substrates but also in semiconductor wafers with integrated circuits.

Although not shown in FIG. 1, an electronic circuit for operating the function element 18 is formed on the surface of the substrate 12, in addition to the function element 18 including a cantilever. The electronic circuit includes electrodes 20 made of aluminum (Al) or copper (Cu). The function element 18 is formed on the surface of the substrate 12 by a micromachining method.

The electronic device 10 according to this embodiment may be used as, for example, a sensor such as accelerometer and a micro gyro in accordance with the configuration of the function element 18 mounted on the substrate 12.

The electronic device 10 includes ultrasonic joint sections 22 for electrically joining the substrate 12 to the lid 14. The lid 14 includes a substrate 14a made of a Si wafer having a surface coated with an insulating layer 15, a recess 14b defining the element mount space 16, and a frame 14c surrounding the recess 14b. Each of the ultrasonic joint sections 22 comprises the electrode 20, a through electrode 24 formed in the lid 14, and a bump 26 made of gold for connecting a lower end of the through electrode 24 to the electrode 20. A solder bump 27 is formed on an upper end of the through electrode 24.

The frame 14c of the lid 14 is provided with through holes 28 in which the through electrodes 24 are formed. The through holes 28 have hole diameters of 30 μm through 100 μm and heights (corresponding to the thickness of the substrate 14a) of 150 μm through 500 μm. Accordingly, the aspect ratio (thickness/hole diameter) of this embodiment ranges from 1.5 through 16.67.

As shown in FIG. 2, the through electrode 24 integrally comprises a columnar electrode 30 filling the through hole 28, a lower end electrode pad 32 formed on a lower end side of the columnar electrode 30 and having a size (horizontal surface area) wider than the cross section of the through hole 28, and an upper end electrode pad 34 formed on an upper end side of the columnar electrode 30 and having a size wider than the cross section of the through hole 28.

The electronic device 10 is provided with an ultrasonic joint section 36 for sealing between a periphery of four edges of the lid 14 and a periphery of four edges of the substrate 12. The ultrasonic joint section 36 seals the element mount space 16 by joining, through a gold bump 42, quadrangular sealing pattern 38 formed on a lower face periphery of the lid 14 and a quadrangular sealing pattern 40 formed on an upper face periphery of the substrate 12. The sealing pattern 38 is made of copper, while the sealing pattern 40 is made of copper or aluminum (Al). The sealing patterns 38 and 40 are integrally joined by Au—Cu bonding through the gold bump 42 or gold plating.

Because the through electrode 24 comprises the lower end electrode pad 32 arranged to seal a lower end opening of the through hole 28 and the columnar electrode 30 filling the through hole 28 by lamination of copper (conductive material) on the lower end electrode pad 32, formation of voids in the center of the columnar electrode 30 is prevented. Therefore, the columnar electrode 30 can be stably formed even if the aspect ratio (thickness/hole diameter) is high.

The lower end electrode pad 32 and the upper end electrode pad 34 each have a size wider than the cross section of the through hole 28, so that the through hole 28 is tightly sealed. This contributes to ensuring airtightness of the element mount space 16. The lower end electrode pad 32 and the upper end electrode pad 34 each have a surface area wider than the hole diameter of the through hole 28. The wider surface area, which is used as a connection area, facilitates connecting work with, for example, soldering.

The following describes a method for forming the through electrode 24 with reference to FIGS. 3-14.

Figure 3:
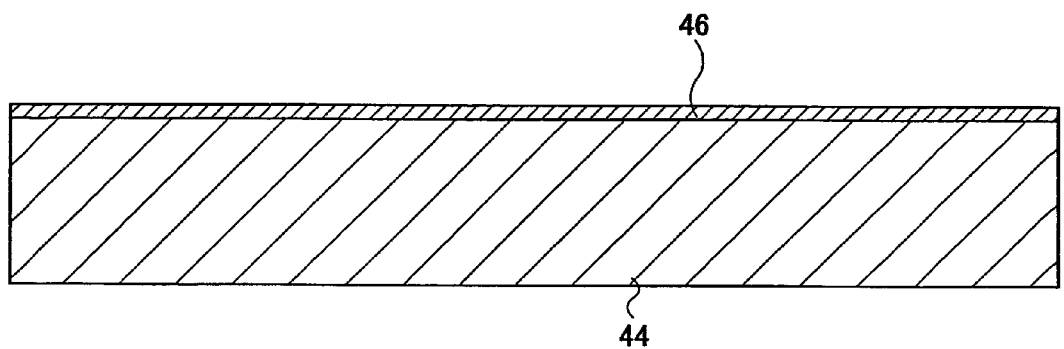
FIGS. 3-14 are vertical cross-sectional views illustrating processes of a first embodiment.

In step 1A shown in FIG. 3, a film-type adhesive tape 46 is applied to the surface of a Si wafer 44, which serves as a support body, by a lamination method. The adhesive tape 46, which is a two-sided adhesive tape having an adhesive layer on each of an upper face and a lower face thereof, tightly adheres to the surface of the Si wafer 44. The adhesive tape 46 serves to join a photoresist layer (adhesive layer) 52 described below and the Si wafer 44. The adhesive tape 46 becomes removable when the contact area is reduced due to explosion of micro capsules in a heat treatment performed after the through electrode 24 is completed.

Figure 4:
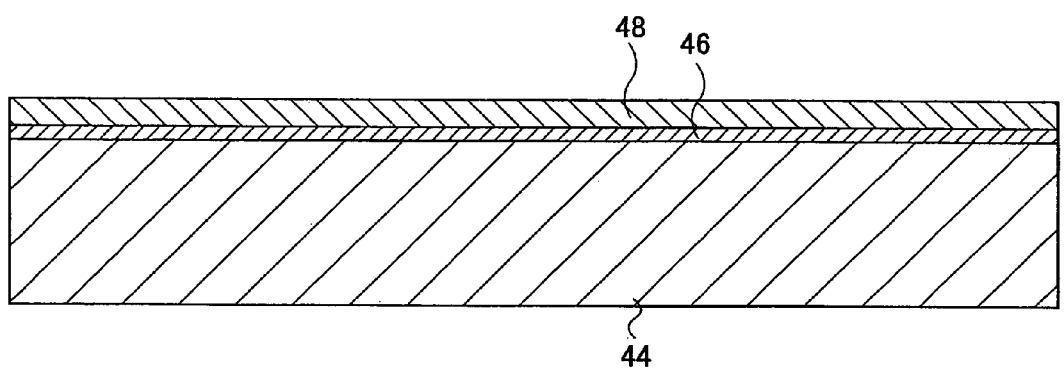

In step 2A shown in FIG. 4, a seed layer 48 is formed on an upper face of the adhesive tape 46 applied to the surface of the Si wafer 44. An example of a method for forming the seed layer 48 includes a method for forming a coating of copper (Cu) by vacuum deposition or sputtering, and a method for laminating a metal foil such as a Cu foil.

Figure 5:
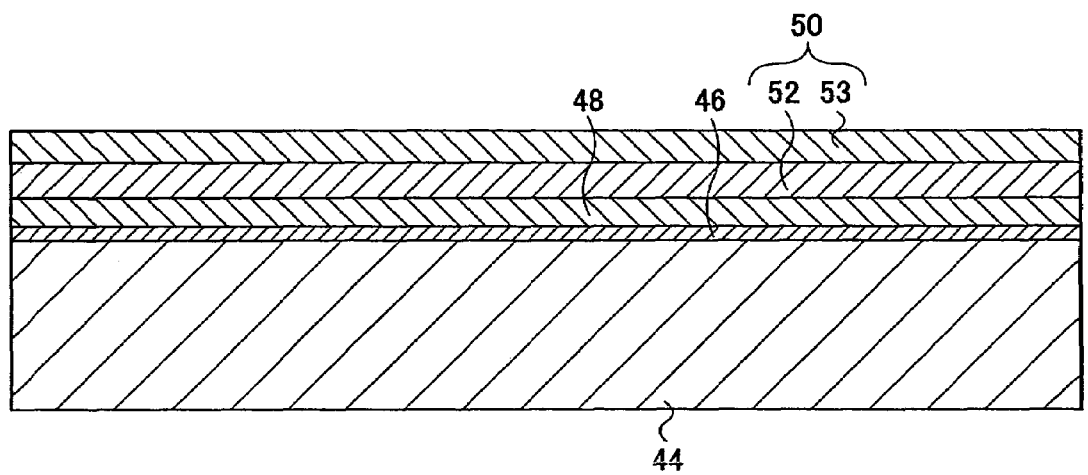

In step 3A shown in FIG. 5, a dry film 50 is applied to the surface of the seed layer 48 by a lamination method or by roller pressing. The dry film 50 has a double layer structure in which a passivation film (PET: polyethylene terephthalate) 53 is joined to an upper face of the photoresist layer 52 used as an adhesive layer. The photoresist layer 52 tightly adheres to the surface of the seed layer 48. The photoresist layer 52 is a negative resist film made of a photosensitive organic material that loses adhesiveness upon exposure and allows an unexposed part thereof to be dissolved and removed by developer. Although the photoresist layer 52 is formed by applying the dry film 50 to the surface of the seed layer 48 in this embodiment, the photoresist layer 52 may be formed by other methods, such as printing, without using the dry film 50. Instead of using the photoresist layer 52, an adhesive agent made of epoxy resin or polyimide resin may be used as the adhesive layer.

Figure 6:
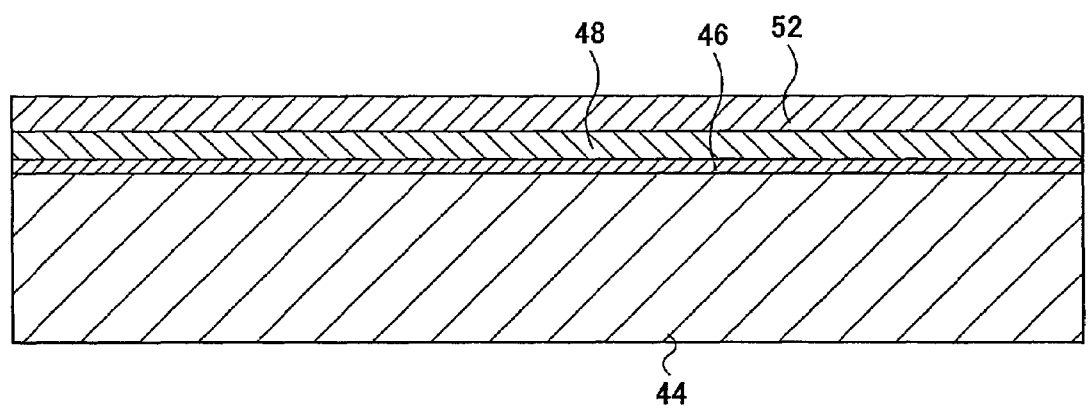

In step 4A shown in FIG. 6, the passivation film 53 of the dry film 50 is peeled and separated from the photoresist layer 52. The upper face and the lower face of the photoresist layer 52 have adhesiveness, and the adhesion between the lower face of the photoresist layer 52 and the seed layer 48 is stronger than the adhesion between the upper face of the photoresist layer 52 and the passivation film 53. Therefore, when the passivation film 53 is peeled off, the photoresist layer 52 is not separated from the seed layer 48. The photoresist layer 52 has a thickness ranging about from 10 μm through 15 μm, which corresponds to the thickness of the lower end electrode pad 32 as described below.

Figure 7:
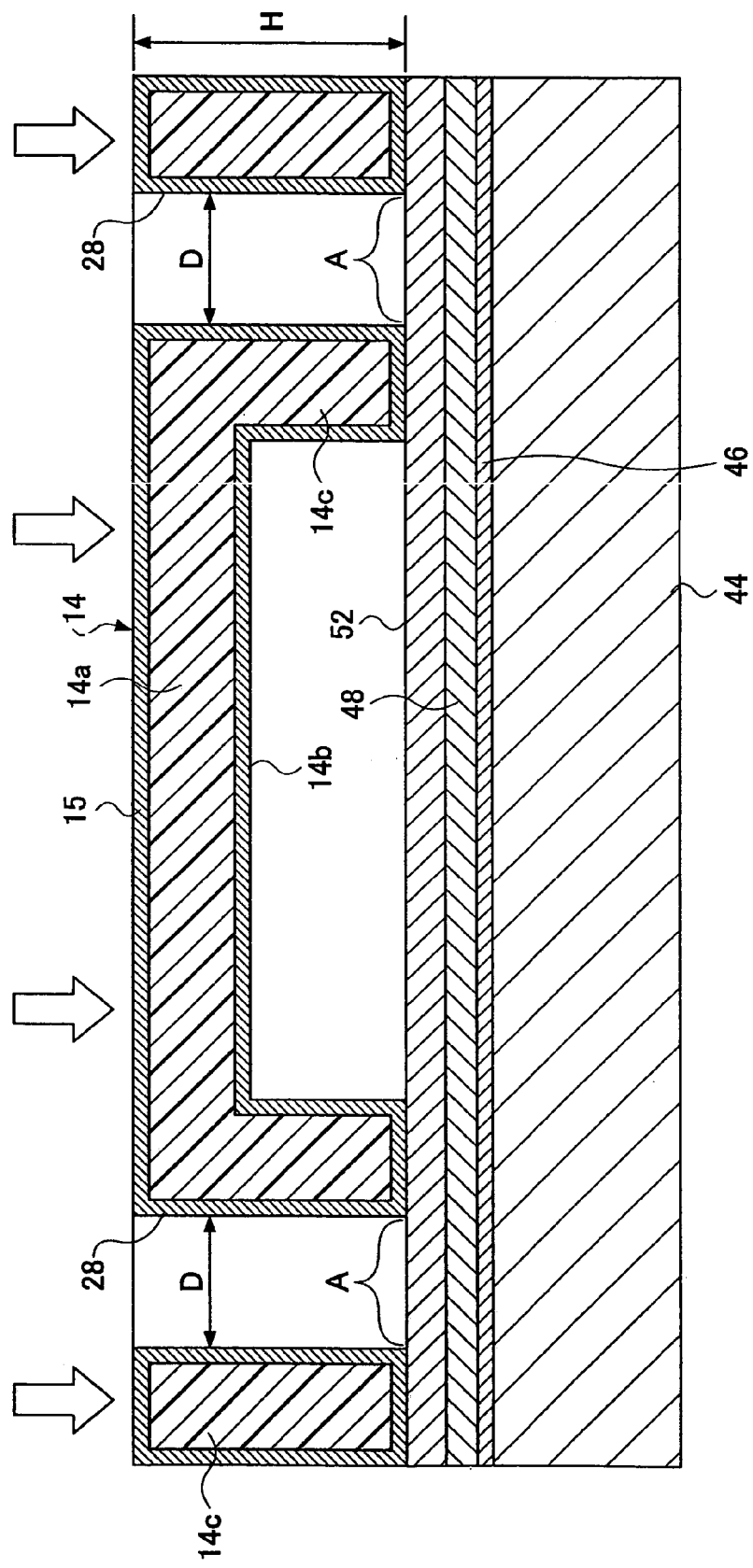

In step 5A shown in FIG. 7, the lid 14 made of a Si wafer is mounted on the adhesive surface of the photoresist layer 52. As previously mentioned, the recess 14b forming the element mount space 16 in the center of the lower face of the lid 14 is formed in the lid 14. The plural through holes 28 are formed to vertically extend through the frame 14c protruding downward and surrounding the recess 14b. The lid 14 is pressed onto the photoresist layer 52, so that the lower face of the frame 14c is press-bonded to the adhesive surface of the photoresist layer 52. In step 5A, the lid 14 is directly press-bonded to the surface of the photoresist layer 52 without using an adhesive tape, thereby eliminating a need for applying an adhesive tape and simplifying the production process.

In this embodiment, because the photoresist layer 52 remains unexposed, the photoresist layer 52 is kept fixed to the lid 14 without losing the adhesiveness in the following processes. The through hole 28 of this embodiment has an inside diameter of about D=30 μm through 60 μm and a height (corresponding to the thickness of the frame 14c) of about H=100 μm through 200 μm.

Figure 8:
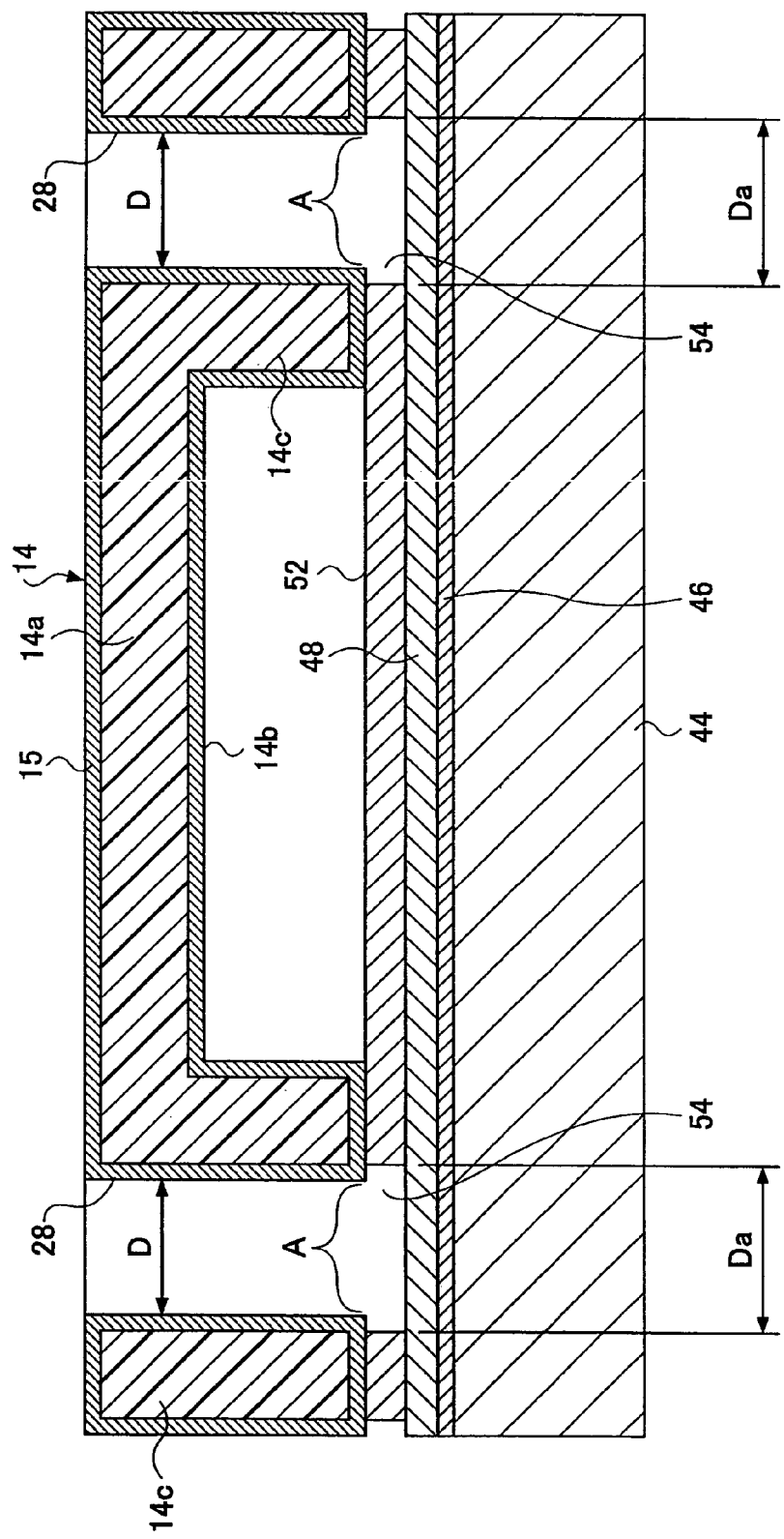

In step 6A shown in FIG. 8, developer is provided into each of the through holes 28 so as to dissolve the photoresist layer 52 in an area A opposing a lower opening of the through hole 28. For providing the developer into the through hole 28 for development, a dip development system for dipping the lid 14 mounted on the Si wafer 44 into the developer or a spray development system for spraying the developer onto the lid 14 from the upper side thereof may be applicable. Both of these development systems can dissolve the photoresist layer 52 in the area A opposing the lower opening of the through hole 28 and, therefore, can form a flange clearance 54 with a width Da (>D) greater than the inside diameter D of the through hole 28 while controlling infiltration time.

In other words, the developer infiltrates from the surface of the photoresist layer 52 in the area A opposing the lower opening of the through hole 28 in the thickness direction to dissolve the photoresist layer 52. As the infiltration time is extended, the developer infiltrates also in the radial direction of the area A to dissolve an area of the photoresist layer 52 larger than the lower opening of the through hole 28. The infiltration time is set in accordance with an infiltration speed which varies depending on a combination of the material of the photoresist layer 52 and the type of the developer.

Then, plasma ashing is performed to generate active oxygen atoms in the dissolved photoresist layer 52 in the area A by electron collision dissociation utilizing plasma. Thus, the photoresist layer 52 is removed from the flange clearance 54. The plasma ashing improves the wetting efficiency of a plating solution in plating processing in the next step.

Figure 9:
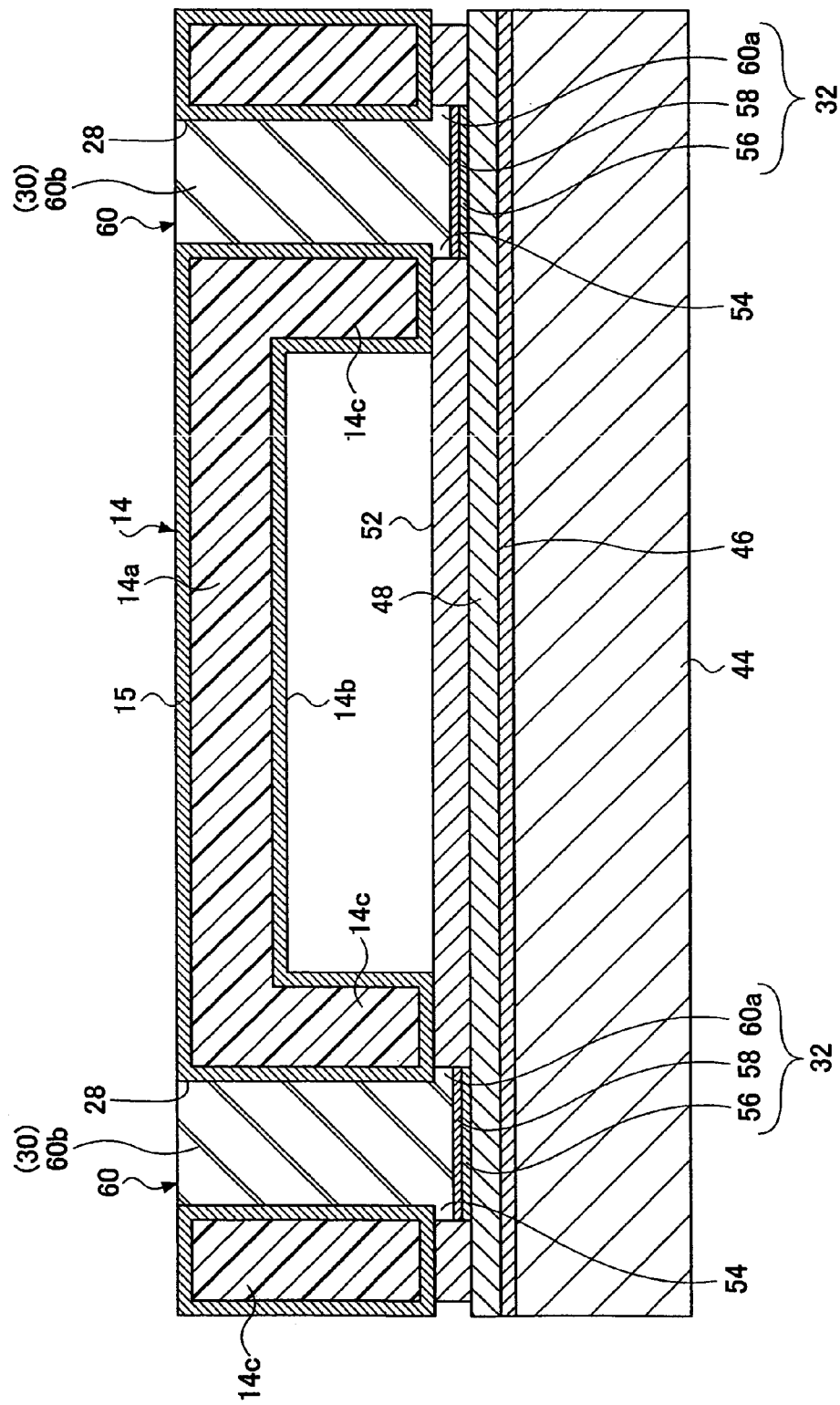

In step 7A shown in FIG. 9, the surface of the seed layer 48 exposed at the bottom of the through hole 28 is gold plated to form an Au plating layer 56 serving as barrier metal that prevents diffusion of the through electrode 24. Then, an upper face of the Au plating layer 56 is nickel plated, so that a Ni plating layer 58 is formed. Subsequently, copper is deposited on the Ni plating layer 58 by an electrolytic plating method, so that a columnar section 60b of a stud via 60 is formed inside the through hole 28. The stud via 60 is formed from bottom to top in the through hole 28 by depositing copper on the surface of the Ni plating layer 58 serving as a base. This prevents formation of voids near the center of the stud via 60 and can fill up the through hole 28 to its upper opening by depositing copper into the through hole 28.

Because the Au plating layer 56 and the Ni plating layer 58 are formed in the flange clearance 54, the size of the Au plating layer 56 and the Ni plating layer 58 is wider than the cross section of the through hole 28. A Cu flange section 60a of the stud via 60 deposited on the Ni plating layer 58 also has a size wider than the cross section of the through hole 28. The Au plating layer 56, the Ni plating layer 58, and the Cu flange section 60a constitute the lower end electrode pad 32. The Cu columnar section 60b deposited on the Cu flange section 60a corresponds to the columnar electrode 30. The plating structure of the electrode pad 32 may be a double layer plating structure of nickel and palladium (palladium on the top side) or may be a three-layer plating structure of nickel, palladium, and gold (gold on the top side).

Figure 10:
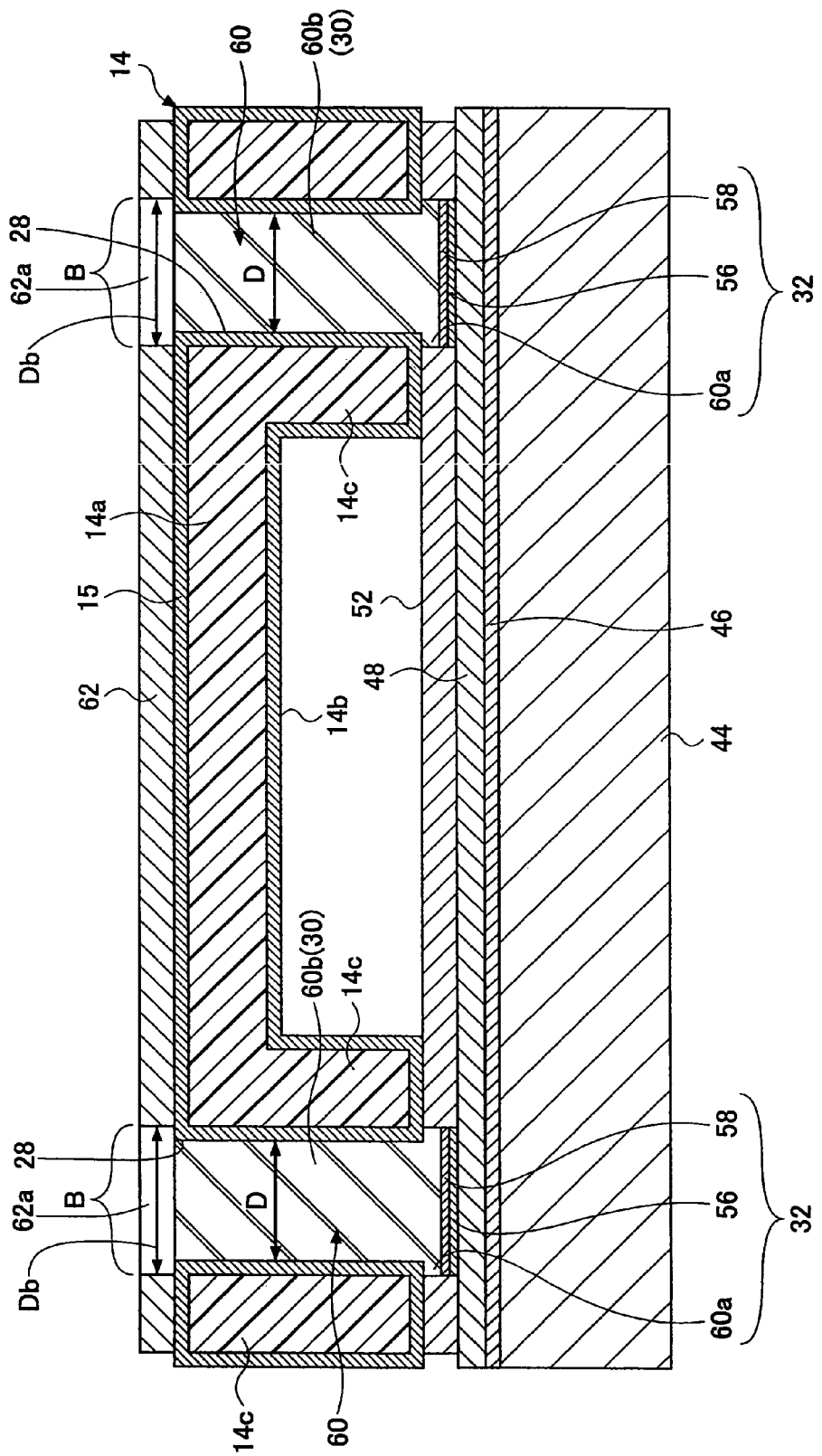

In step 8A shown in FIG. 10, a dry film is applied to an upper face of the lid 14 by a lamination method to form a negative resist layer 62. The negative resist layer 62 in an area B opposing an upper end of the stud via 60 is exposed and cured, and an unexposed part of the negative resist layer 62 is removed by developer. With this patterning process, a part of the negative resist layer 62 of an area wider than the upper opening of the through hole 28 is dissolved. Thus, a flange clearance 62a continuous to the upper end of the stud via 60 (upper side of the through hole 28) is formed. The flange clearance 62a formed in the negative resist layer 62 has a width Db (>D) greater than the inside diameter D of the through hole 28.

Figure 11:
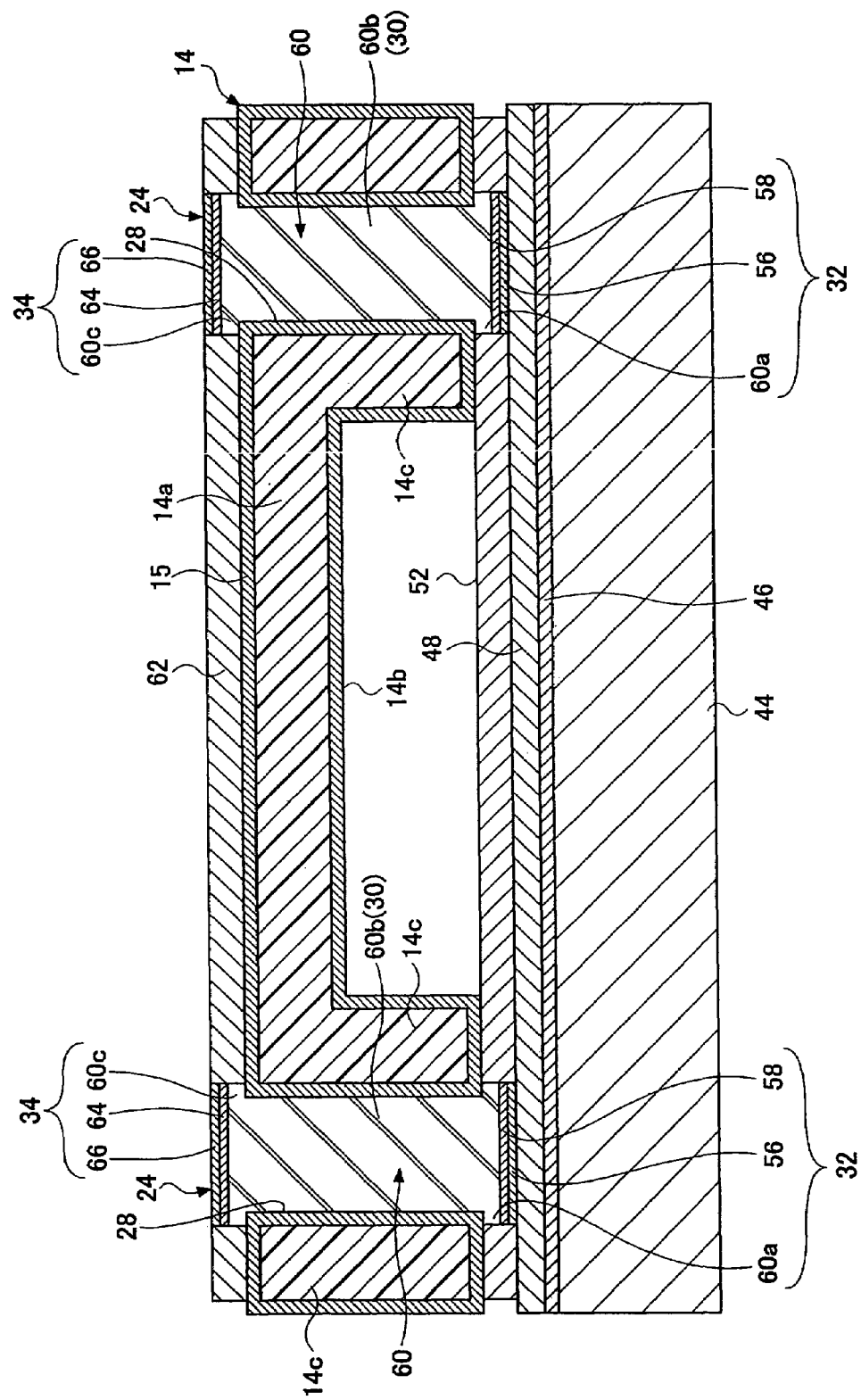

In step 9A shown in FIG. 11, a Cu flange section 60c is formed on the upper end of the Cu columnar section 60b by electrolytic plating. The Cu flange section 60c has an area wider than the cross section of the through hole 28, because the Cu flange section 60c is formed in the flange clearance 62a having an area wider than the cross section of the through hole 28. A Ni plating layer 64 is formed on an upper face of the Cu flange section 60c by electrolytic plating. Then, an electrolytic Au plating layer (or Sn plating layer) 66 serving as barrier metal is formed on an upper face of the Ni plating layer 64 by electrolytic gold plating. The Au plating layer (or Sn plating layer) 66, the Ni plating layer 64, and the Cu flange section 60c constitute the upper end electrode pad 34.

The plating structure of the electrode pad 34 may be a double layer plating structure of nickel and palladium (palladium on the top side) or may be a three-layer plating structure of nickel, palladium, and gold (gold on the top side).

Figure 12:
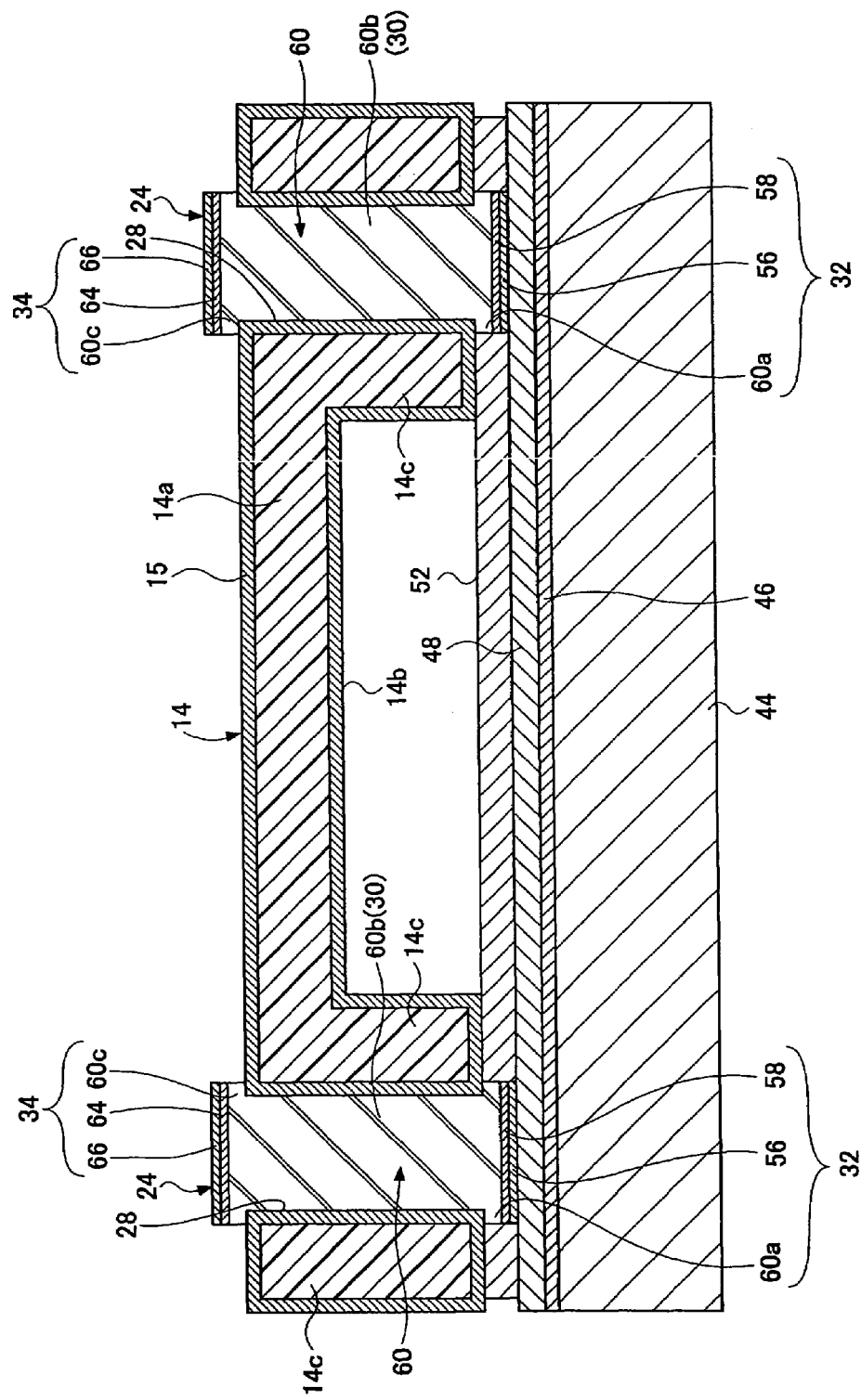

In step 10A shown in FIG. 12, the exposed part of the negative resist layer 62 on the lid 14 is removed by swelling with use of remover (e.g. alkaline solution, caustic soda, etc.).

Figure 13:
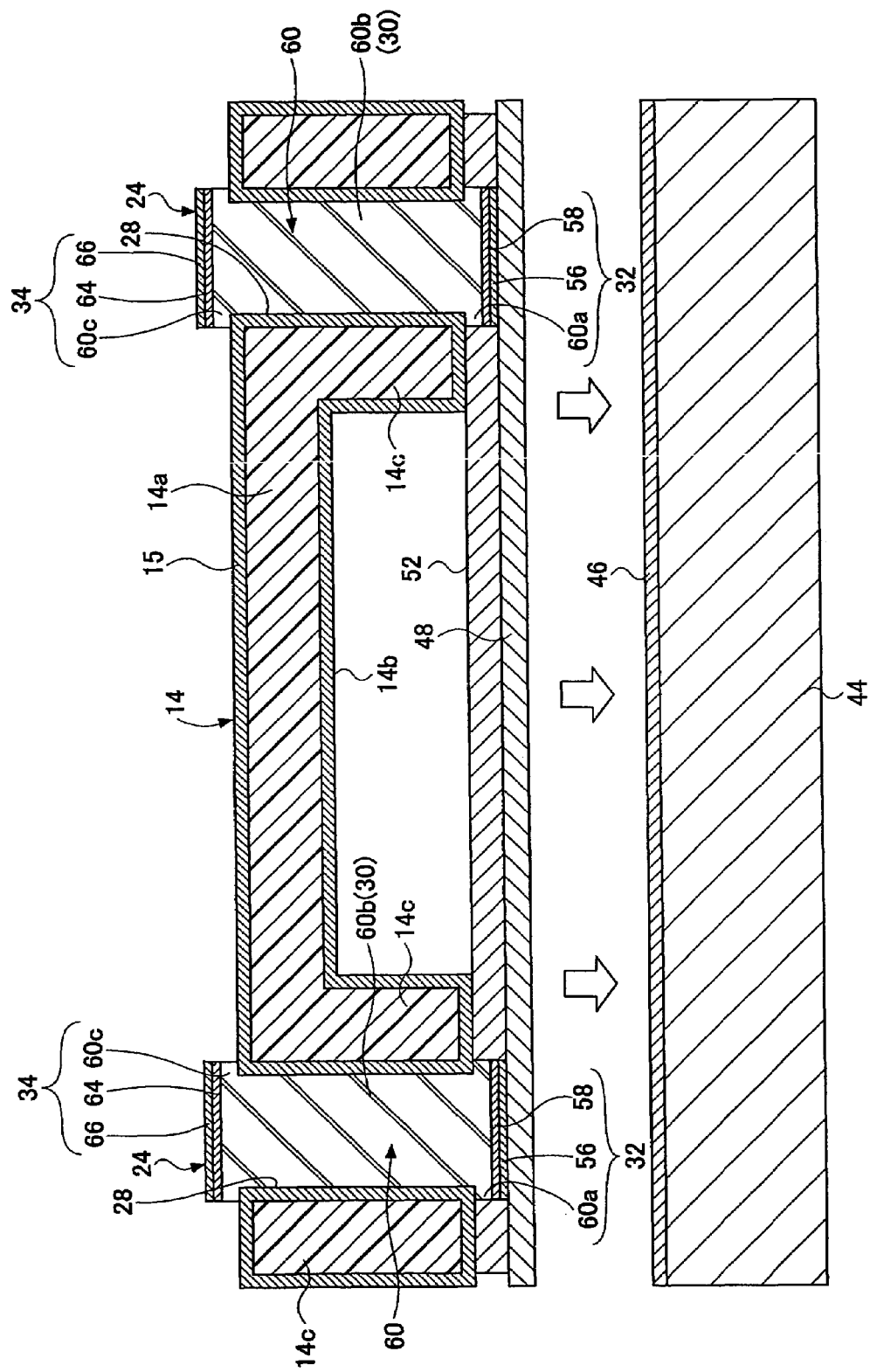

In step 11A shown in FIG. 13, the Si wafer 44 is heated to a high temperature in a baking process, so that the microcapsules contained in the adhesive tape 46 are exploded. When the micro capsules contained in the adhesive tape 46 are exploded, the contact area of the adhesive tape 46 is reduced. Therefore, the Si wafer 44 bonded to the seed layer 48 through the adhesive tape 46 becomes easily separable from the seed layer 48.

Other methods may be used for separating the Si wafer 44 without being limited to the above method. For example, the Si wafer 44 may be removed by buffing.

Figure 14:
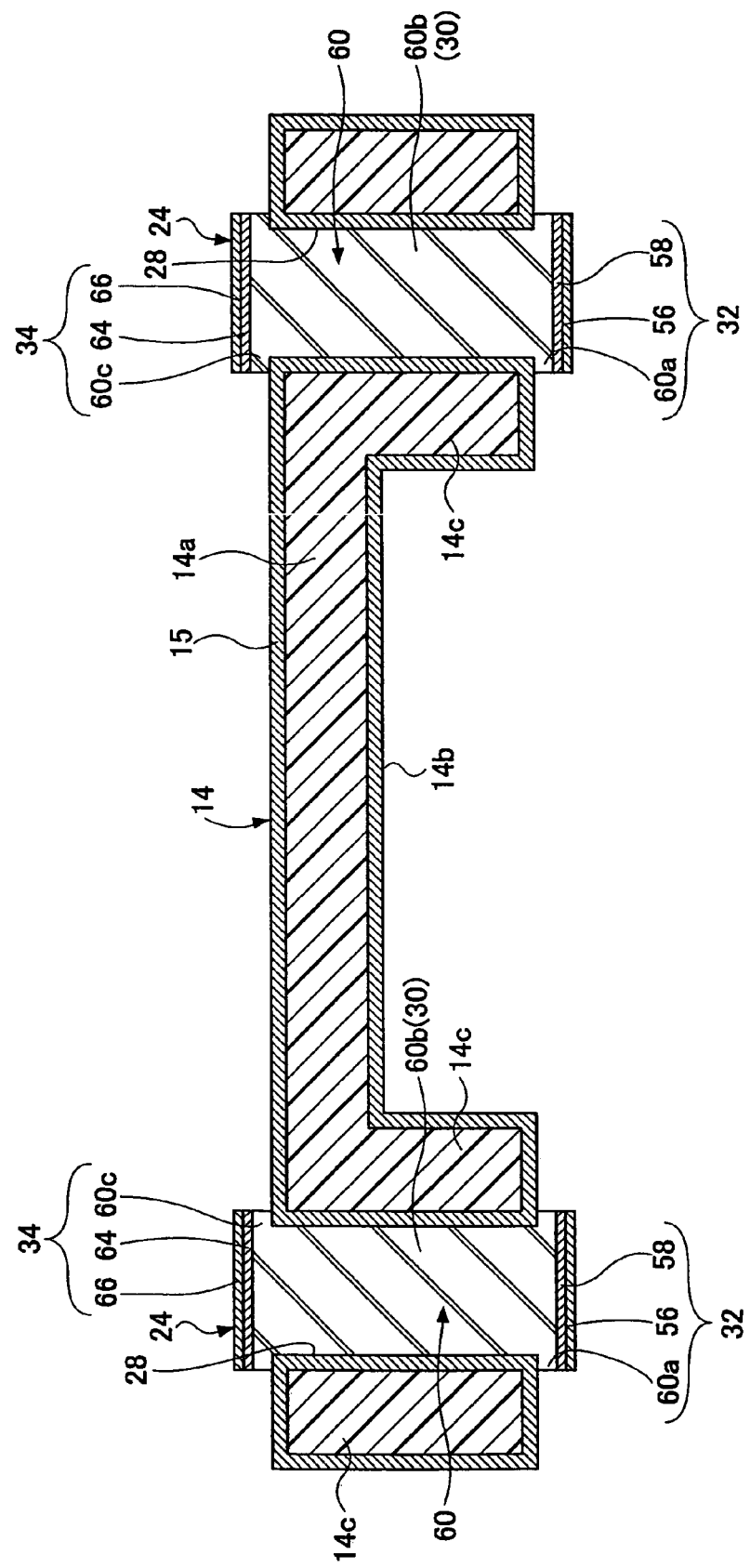

In step 12A shown in FIG. 14, the seed layer 48 is removed by etching. Then, the photoresist layer 52 bonded to the lower face of the lid is removed by using remover (e.g. alkaline solution, caustic soda, etc.) In this way, the lid 14 having the through electrodes 24 is completed.

The through electrode 24 formed by the above-described forming method has a configuration in which the columnar electrode 30 filling the through hole 28 extending through the substrate 14a of the lid 14, the lower end electrode pad 32 formed on the lower end side of the columnar electrode 30 and having an area wider than the cross section of the through hole 28, and the upper end electrode pad 34 formed on the upper end side of the columnar electrode 30 and having an area wider than the cross section of the through hole 28 are integrally joined. Therefore, both upper and lower ends of the through hole 28 are tightly sealed. Moreover, as the columnar electrode 30 is formed from bottom to top on the lower end electrode pad 32, formation of voids near the center of the through hole 28 is prevented. Therefore, the columnar electrode 30 can be stably formed in the through hole 28 even if the aspect ratio (thickness/hole diameter) is high.

In this embodiment, the seed layer 48 is formed on the surface of the Si wafer 44 with the adhesive tape 46 interposed therebetween. Therefore, after the through electrode 24 is formed, the Si wafer 44 can be easily separated from the seed layer 48 by heating the adhesive tape 46. This simplifies a production process, and lowers production costs.

Second Embodiment

The following describes a second embodiment of a method for forming the through electrode 24 with reference to FIGS. 15-26. In the second embodiment, elements identical to those in the first embodiment bear the same reference numerals.

Figure 15:
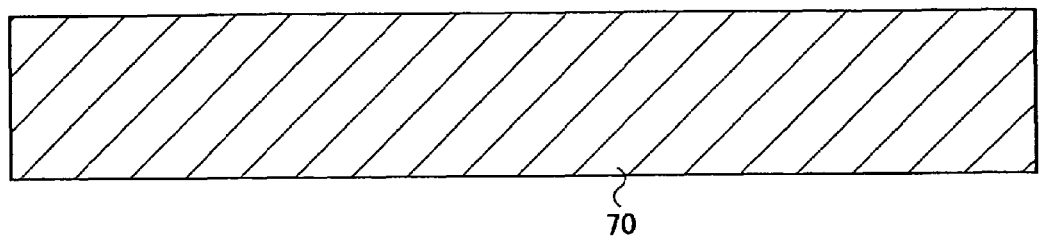
FIGS. 15-26 are vertical cross-sectional views illustrating processes of a second embodiment.

In step 1B shown in FIG. 15, a glass wafer 70 serving as a support body is prepared.

Figure 16:
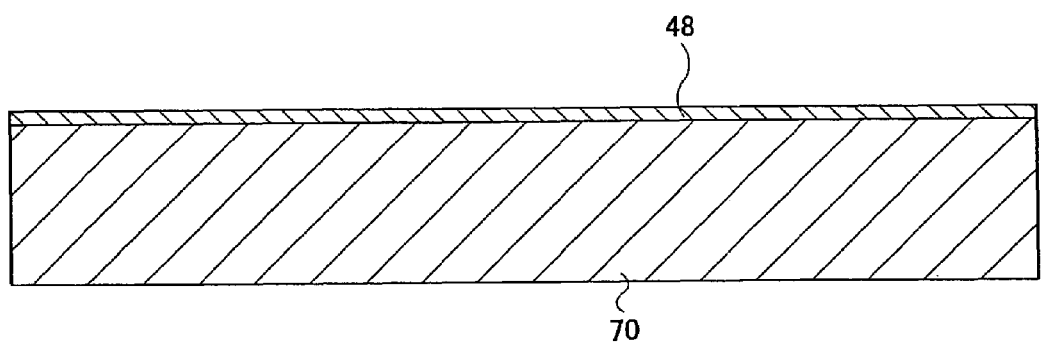

In step 2B shown in FIG. 16, a seed layer 48 is formed on an upper face of the glass wafer 70. An example of a method for forming the seed layer 48 includes vacuum deposition or sputtering of copper or nickel.

Figure 17:
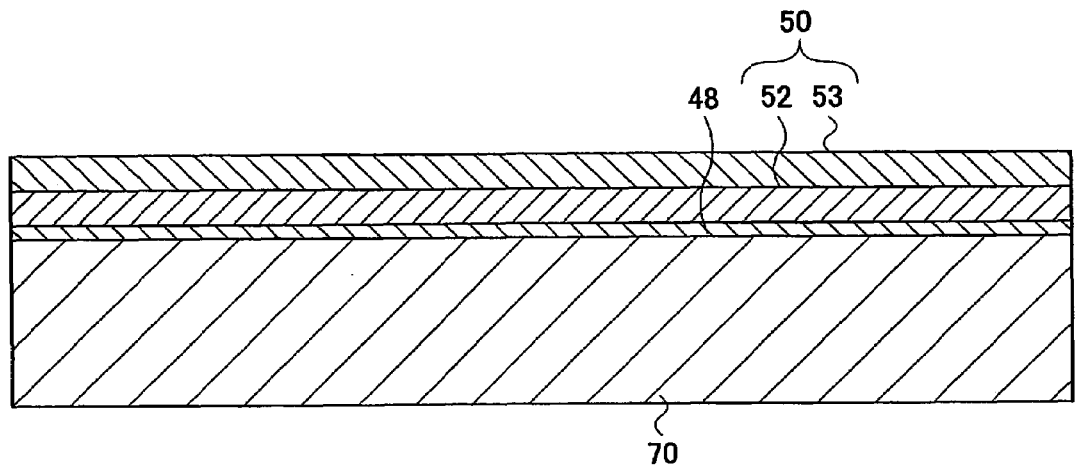

In step 3B shown in FIG. 17, a dry film 50 is applied to the surface of the seed layer 48 by a lamination method.

Figure 18:
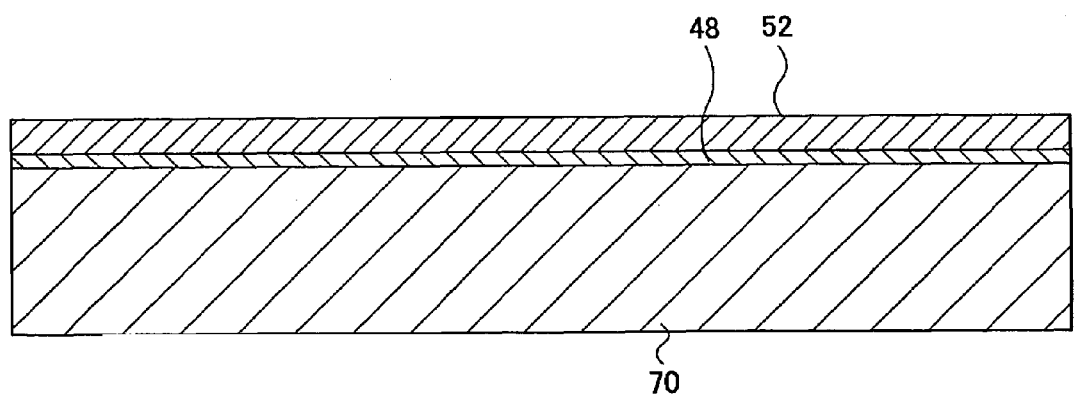

In step 4B shown in FIG. 18, a passivation film 53 of the dry film 50 is peeled and separated from a photoresist layer 52.

Figure 19:
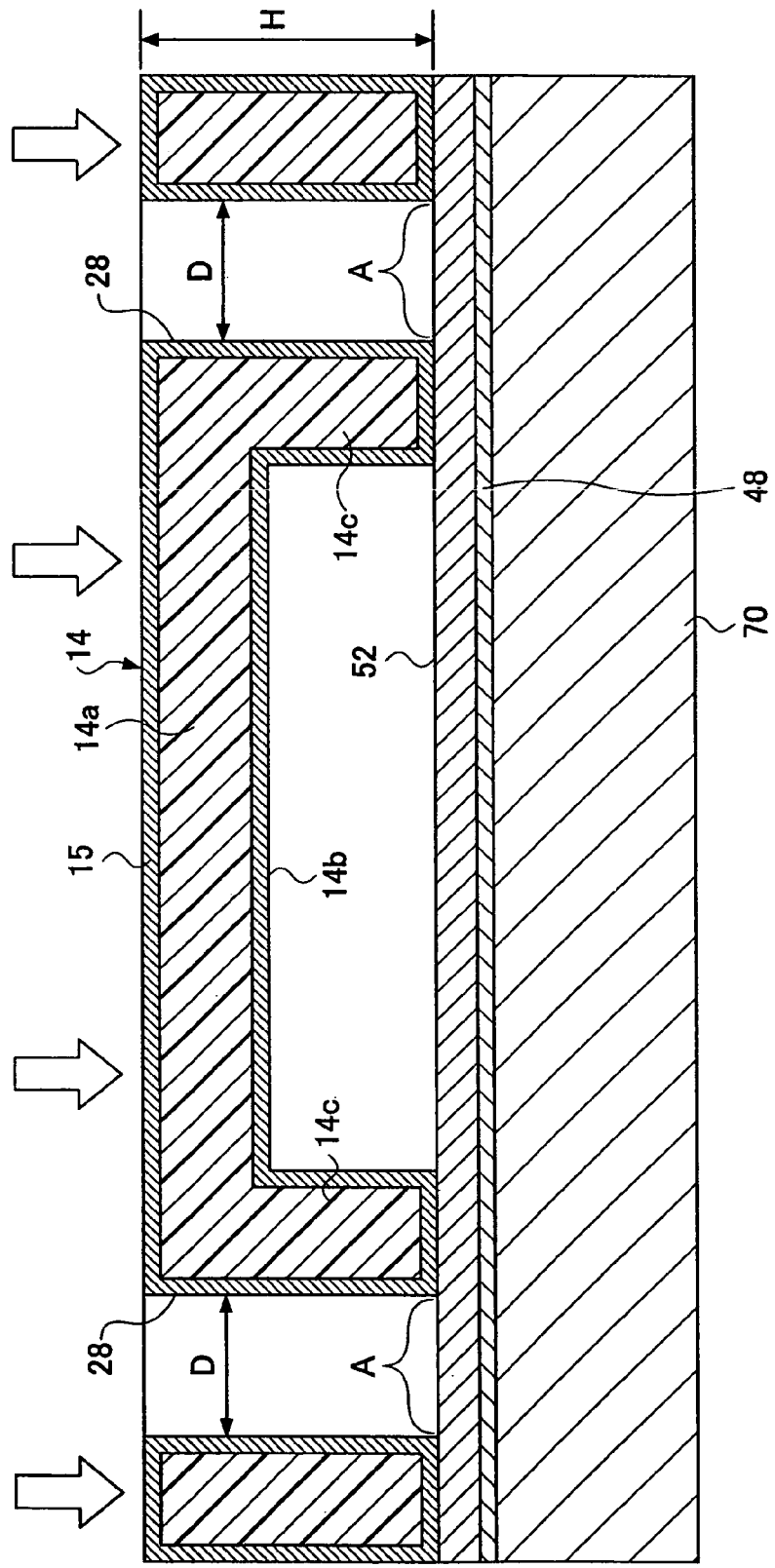

In step 5B shown in FIG. 19, the lid 14 made of a Si wafer is attached on an adhesive surface of the photoresist layer 52. A recess 14b forming an element mount space 16 (see FIG. 1) in the center on a lower face of the lid 14 is formed in the lid 14. Through holes 28 are formed to vertically extend through a frame 14c protruding downward and surrounding the recess 14b. The lid 14 is pressed onto the photoresist layer 52, so that a lower face of the frame 14c is press-bonded to the adhesive surface of the photoresist layer 52.

Figure 20:
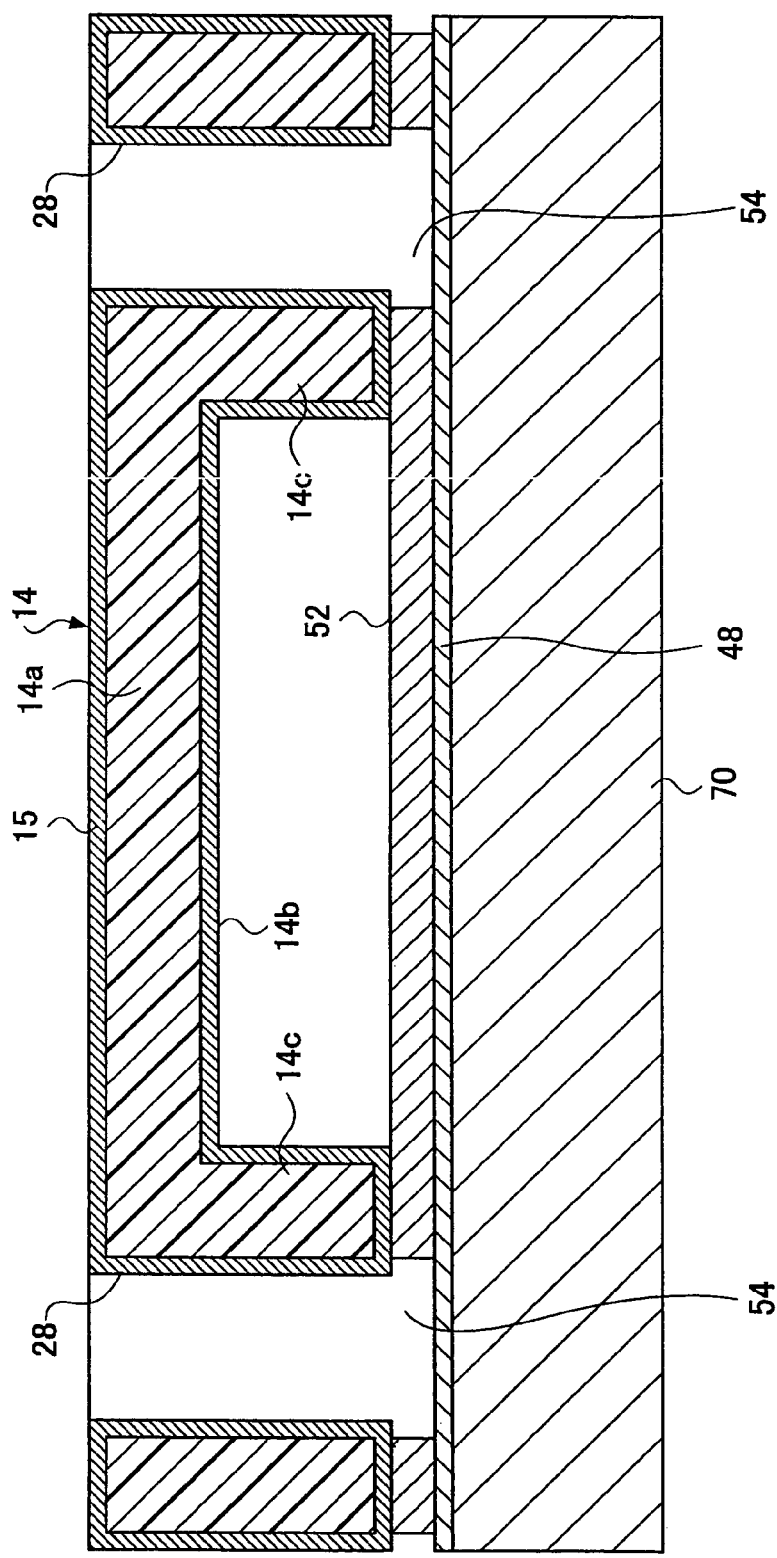

In step 6B shown in FIG. 20, developer is provided into each of the through holes 28 so as to dissolve the photoresist layer 52 in an area A (see FIG. 8) opposing a lower opening of the through hole 28. The developer provided into the through hole 28 can dissolve the photoresist layer 52 in the area A opposing the lower opening of the through hole 28 and, therefore, can form a flange clearance 54 with a width Da (>D) (see FIG. 8) greater than the inside diameter D of the through hole 28 while controlling infiltration time.

Then, plasma ashing is performed to generate active oxygen atoms in the dissolved photoresist layer 52 in the area A by electron collision dissociation utilizing plasma. Thus, the photoresist layer 52 is removed from the flange clearance 54. The plasma ashing improves the wetting efficiency of a plating solution in plating processing in the next step.

Figure 21:
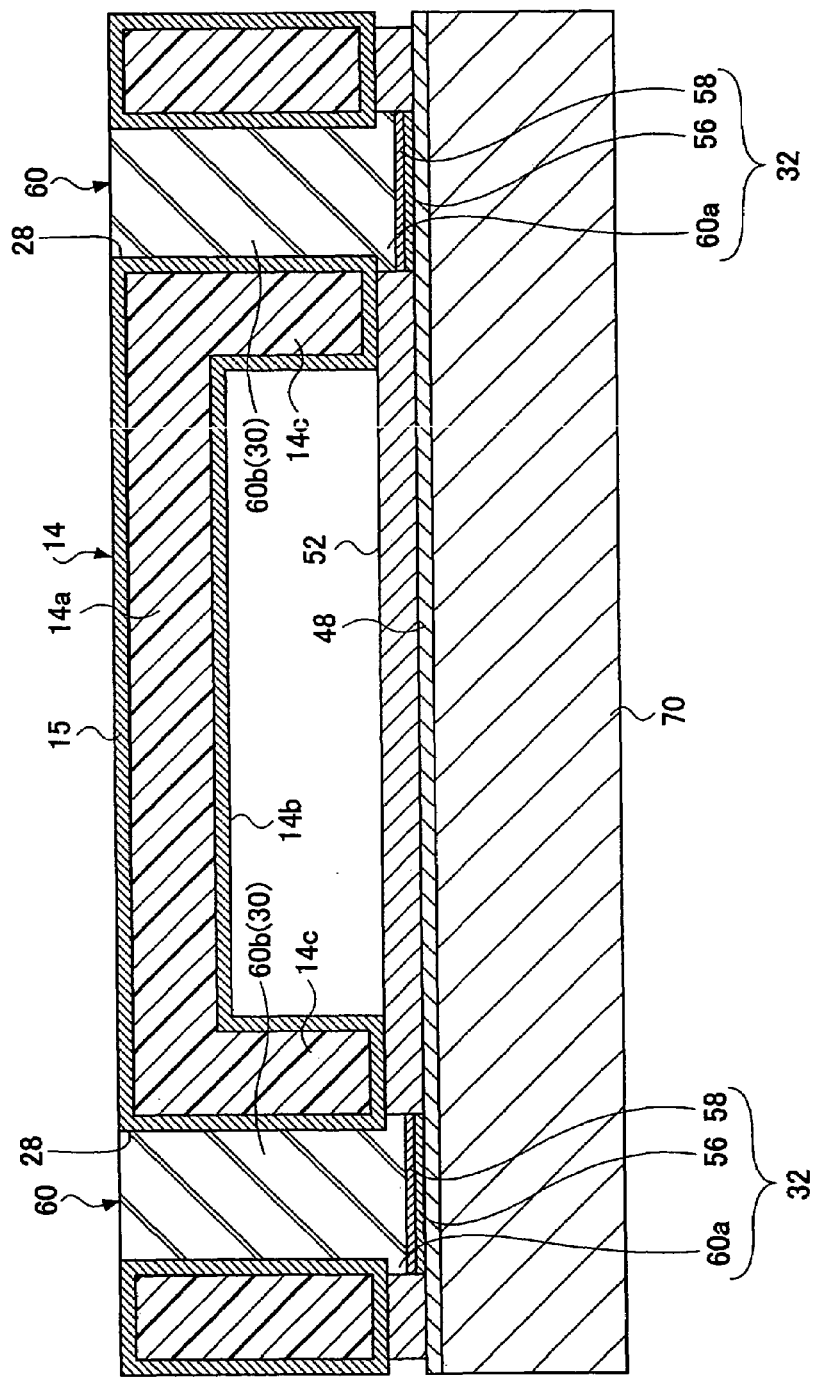

In step 7B shown in FIG. 21, the surface of the seed layer 48 exposed at the bottom of the through hole 28 is gold plated to form an Au plating layer 56 serving as barrier metal that prevents diffusion of the through electrode 24. Then, an upper face of the Au plating layer 56 is nickel plated, so that a Ni plating layer 58 is formed. Subsequently, copper is deposited on the Ni plating layer 58 by an electrolytic plating method, so that a columnar section 60b of a stud via 60 is formed inside the through hole 28. The stud via 60 is formed bottom to top in the through hole 28 by depositing copper on the surface of the Ni plating layer 58 serving as a base. This prevents formation of voids near the center of the stud via 60 and can fill up the through hole 28 to the upper opening of by depositing copper into the through hole 28.

Because the Au plating layer 56 and the Ni plating layer 58 are formed in the flange clearance 54, the area of the Au plating layer 56 and the Ni plating layer 58 is wider than the cross section of the through hole 28. A Cu flange section 60a of the stud via 60 deposited on the Ni plating layer 58 also has an area wider than the cross section of the through hole 28.

Figure 22:
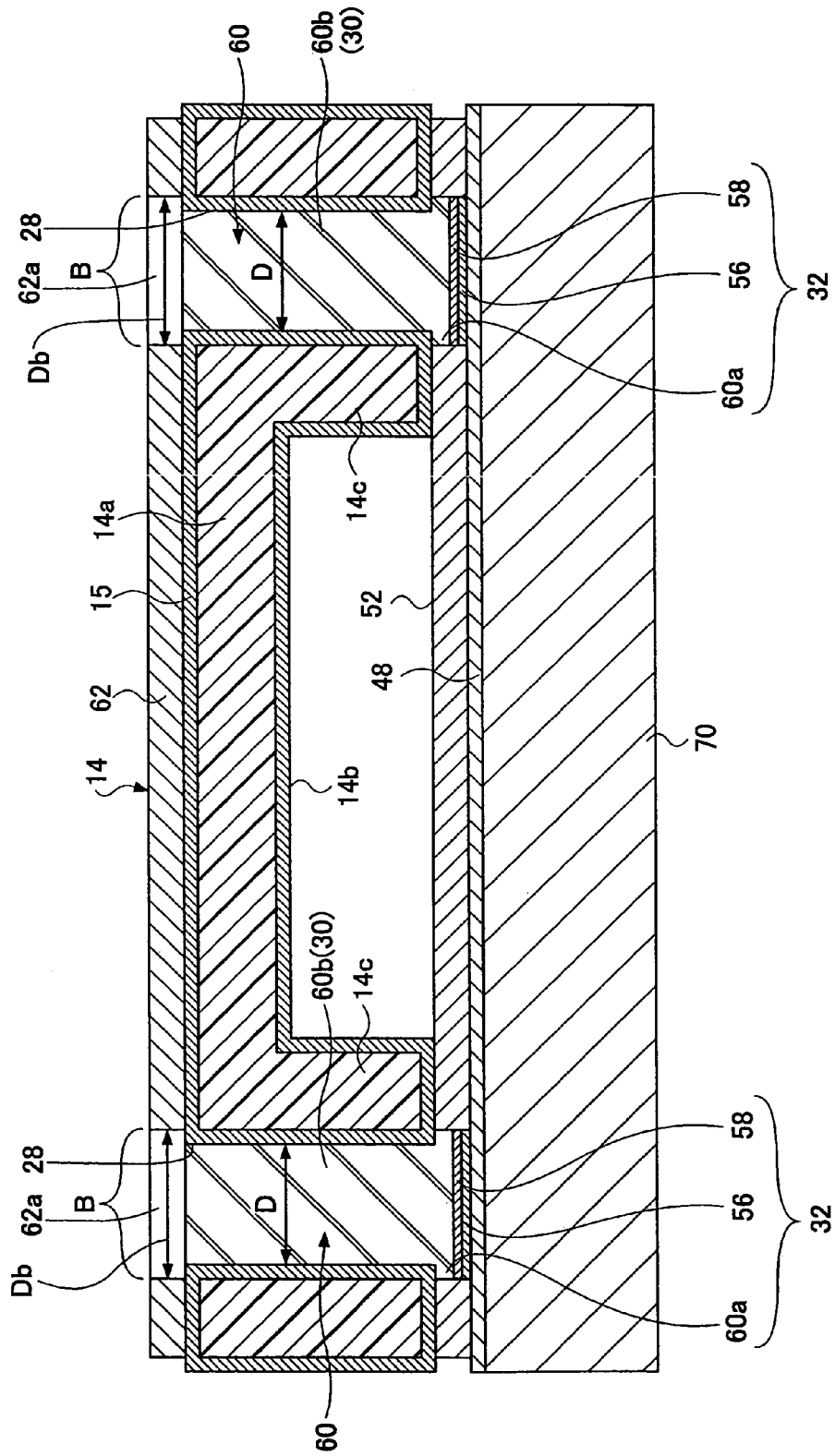

In step 8B shown in FIG. 22, a dry film is applied to an upper face of the lid 14 by a lamination method to form a negative resist layer 62. The negative resist layer 62 in an area B opposing an upper end of the stud via 60 is exposed and cured, and an unexposed part of the negative resist layer 62 is removed by developer. With this patterning process, a part of the negative resist layer 62 of an area wider than the upper opening of the through hole 28 is dissolved. Thus, a flange clearance 62a continuous to the upper end of the stud via 60 (upper side of the through hole 28) is formed. The flange clearance 62a formed in the negative resist layer 62 has a width Db (>D) greater than the inside diameter D of the through hole 28.

Figure 23:
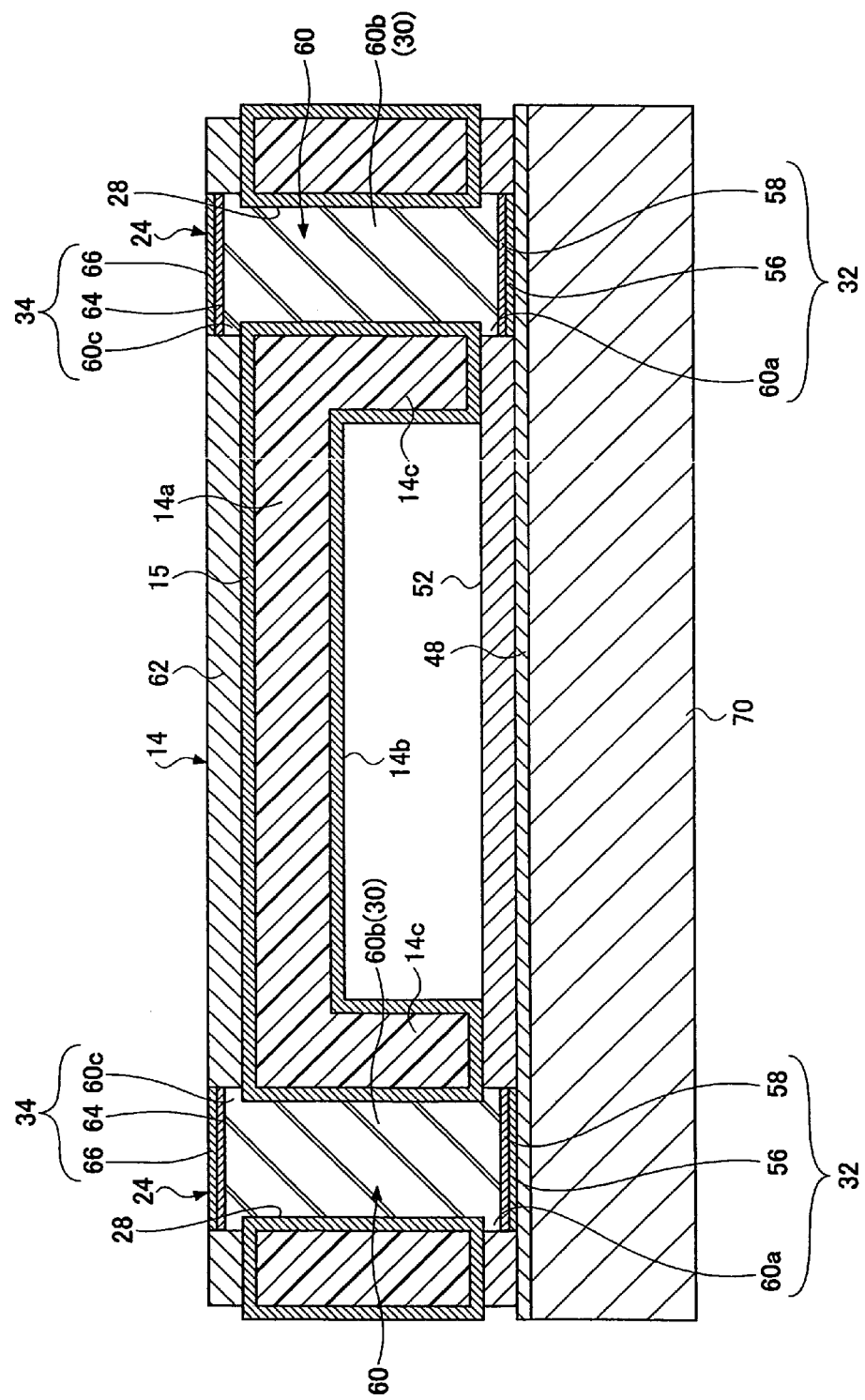

In step 9B shown in FIG. 23, a Cu flange section 60c is formed on the upper end of the Cu columnar section 60b by plating. The Cu flange section 60c has an area wider than the cross section of the through hole 28, because the Cu flange section 60c is formed in the flange clearance 62a having an area wider than the cross section of the through hole 28. A Ni plating layer 64 is formed on the upper face of the Cu flange section 60c by electroless plating. Then, an electrolytic Au plating layer (or Sn plating layer) 66 serving as barrier metal is formed on an upper face of the Ni plating layer 64 by electroless plating.

Figure 24:
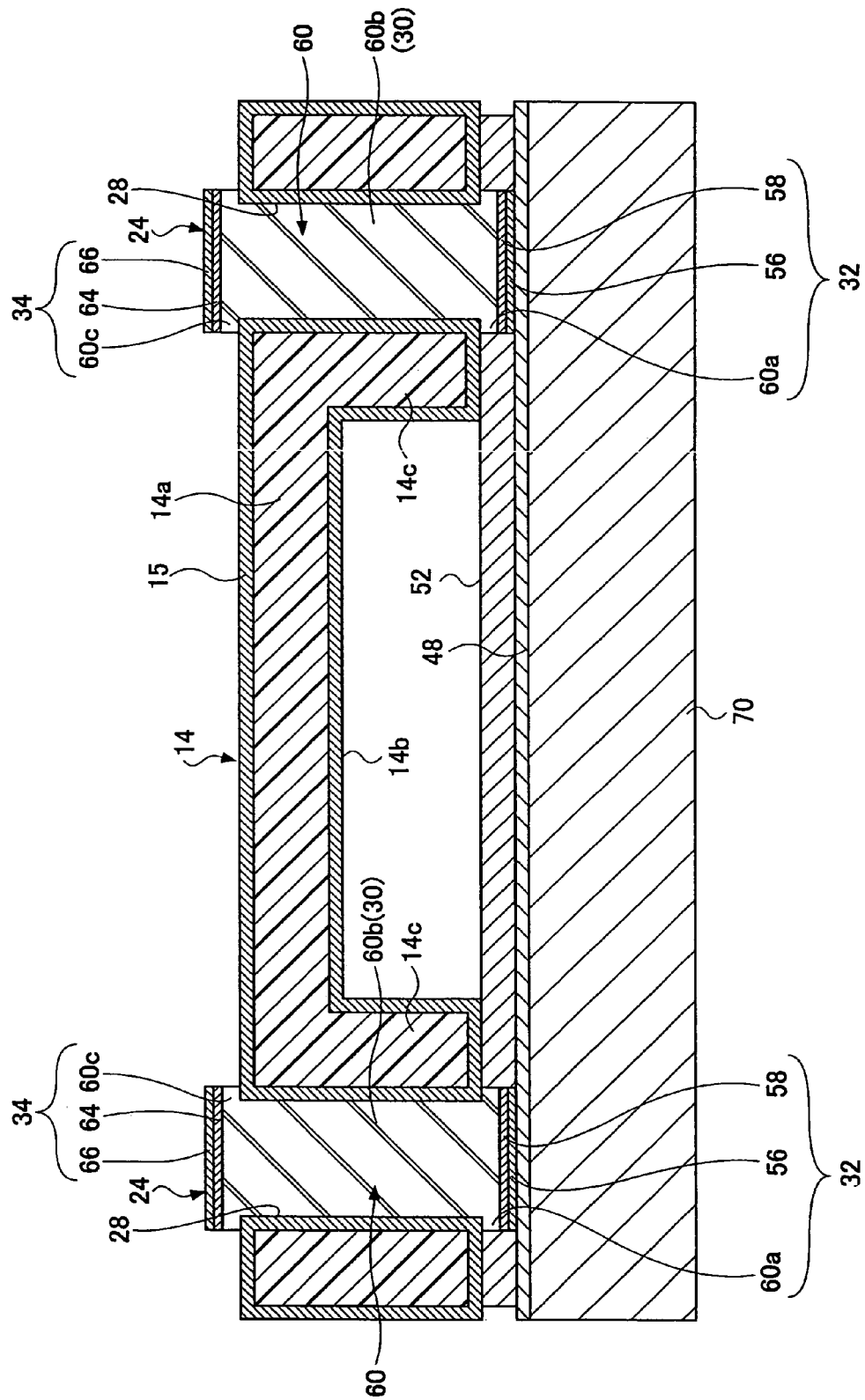

In step 10B shown in FIG. 24, the exposed negative resist layer 62 on the lid 14 is removed therefrom by swelling with use of a remover (e.g. alkaline solution, caustic soda, etc.).

Figure 25:
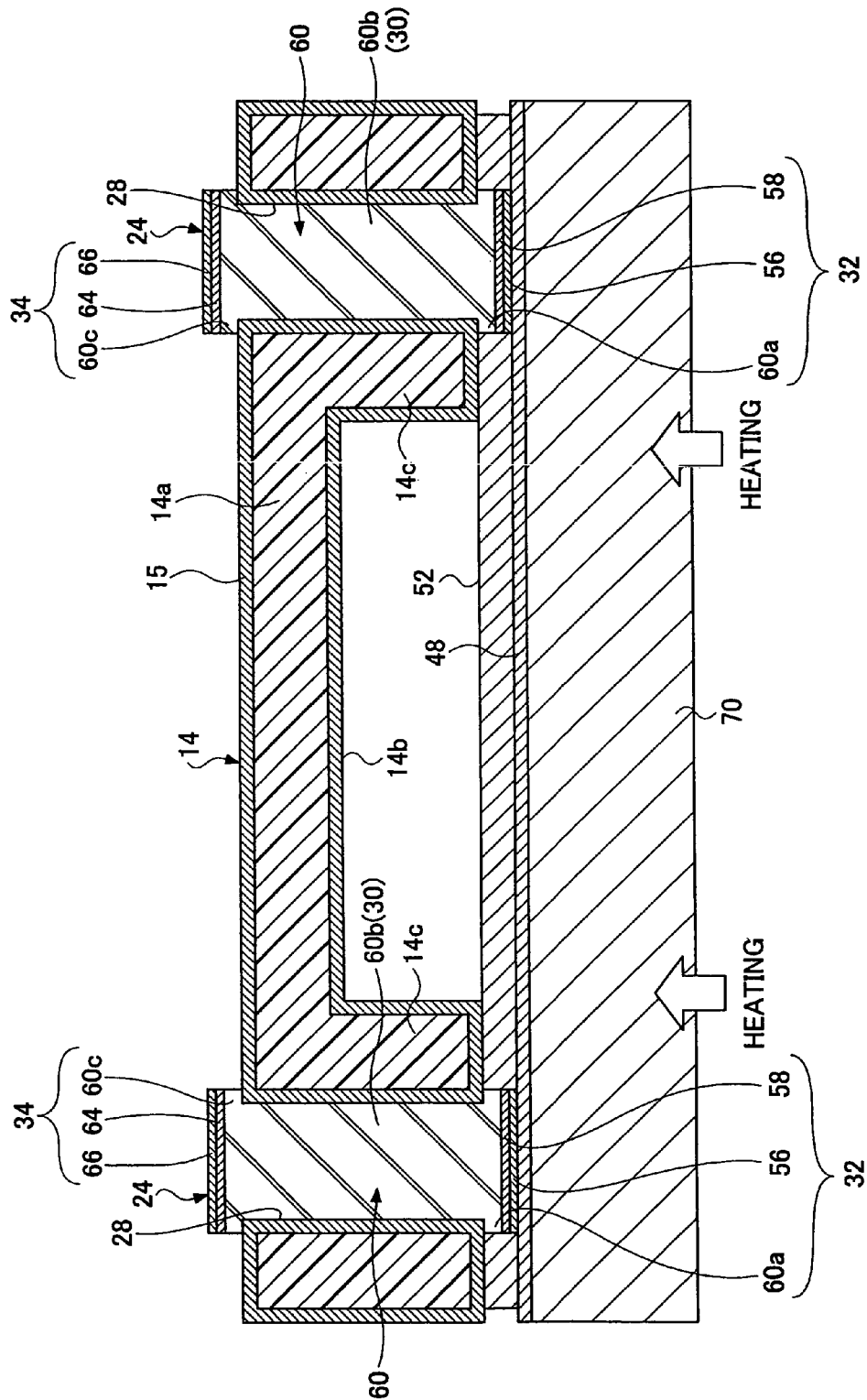

In step 11B shown in FIG. 25, the glass wafer 70 is heated to a high temperature from the lower side in a baking process, so that the photoresist layer 52 is cured. The photoresist layer 52 thus loses adhesiveness, so that the photoresist layer 52 becomes easily separable from the lid 14.

Figure 26:
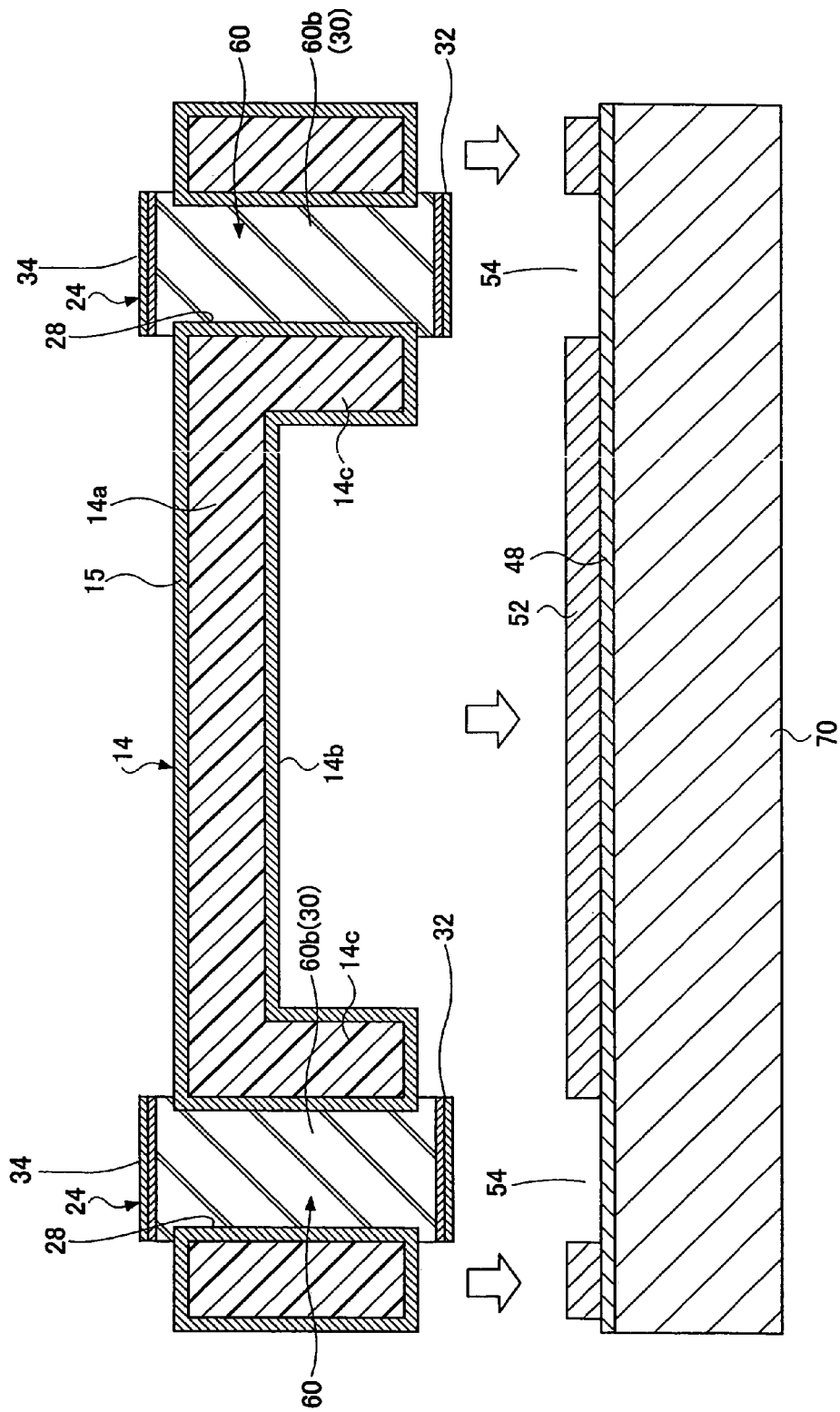

In step 12B shown in FIG. 26, the glass wafer 70 is separated to the lower side, so that the photoresist layer 52 is separated from the lower surface of the lid 14. In this way, the lid 14 having the through electrodes 24 is completed.

While the glass wafer 70 is heated in step 11B for separation of the photoresist layer 52, other methods may be applicable. For example, the photoresist layer 52 may be separated from the lower face of the lid 14 by removing the glass wafer 70 by grinding, and then removing the seed layer 48 by etching.

The through electrode 24 formed by the above-described forming method has a configuration in which the columnar electrode 30 filling the through hole 28 extending through the substrate 14a of the lid 14, the lower end electrode pad 32 formed on the lower end side of the columnar electrode 30 and having an area wider than the cross section of the through hole 28, and the upper end electrode pad 34 formed on the upper end side of the columnar electrode 30 and having an area wider than the cross section of the through hole 28 are integrally joined. Therefore, both upper and lower ends of the through hole 28 are tightly sealed. Moreover, as the columnar electrode 30 is formed from bottom to top on the lower end electrode pad 32, formation of voids near the center of the through hole 28 is prevented. Therefore, the columnar electrode 30 can be stably formed in the through hole 28 even if the aspect ratio (thickness/hole diameter) is high.

In this embodiment, the glass wafer 70 can be easily separated from the lid 14 by heating the photoresist layer 52 formed on the surface of the glass wafer 70 with the seed layer 48 interposed therebetween. This simplifies a production process, and lowers production costs.

While micromachine packages for electronic devices are exemplified in the above embodiments, the present invention is also applicable to electrodes used in other products (e.g. interposers and products having through holes for connecting upper face side wiring patterns and lower face side wiring patterns).

The present application is based on Japanese Priority Application No. 2004-191488 filed on Jun. 29, 2004, with the Japanese Patent Office, the entire contents of which are hereby incorporated by reference.

We claim:

1. A method for forming a through electrode, comprising:
a first step of providing a substrate having a through hole formed therein onto a seed layer via an adhesive layer;
a second step of removing a portion of the adhesive layer that communicates with the through hole of the substrate to form a clearance wider than a cross section of the through hole at a lower end of the through hole;
a third step of filling the clearance and the through hole with a conductor to form a flange-shaped lower end electrode pad covering the lower end of the through hole and a columnar electrode filling the through hole, said flang-shaped lower end electrode pad and said columnar electrode being formed in the through hole of the substrate; and
a fourth step of removing the seed layer, and the adhesive layer from the substrate.

2. The method for forming a through electrode as claimed in claim 1, wherein the third step includes:
a step of forming an Au layer constituting the lower end electrode pad on the surface of the seed layer;
a step of forming a Ni layer on a surface of the Au layer; and
a step of laminating a Cu layer on a surface of the Ni layer to form the columnar electrode.

3. The method for forming a through electrode as claimed in claim 1,
wherein an adhesive tape is applied to the surface of a support body, and then the seed layer is formed on an adhesive face of the adhesive layer so that the substrate can be attached to the adhesive tape via the seed layer in the first step; and
after the columnar electrode is formed in the third step, the support body is separated from the seed layer by heating the adhesive tape in the fourth step.

4. The method for forming a through electrode as claimed in claim 1,
wherein the seed layer is formed on the surface of a support body, and then the adhesive layer is formed on the seed layer so that the substrate is provided on the seed layer via the adhesive layer in the first step; and
after the columnar electrode is formed inside the through hole in the third step, the support body is separated from the substrate by heating the adhesive layer in the fourth step.

5. The method for forming a through electrode as claimed in claim 1,
wherein the adhesive layer includes a photoresist layer; and
the second step includes a step of removing the photoresist layer formed in the area communicating with the through hole of the substrate by a development process; and
a step of forming the clearance wider than the cross section of the through hole at the lower end of the through hole.

6. A method for forming a through electrode, comprising:
a first step of providing a substrate having a through hole formed therein onto a seed layer via an adhesive layer;
a second step of removing a portion of the adhesive layer that communicates with the through hole of the substrate to form a clearance wider than a cross section of the through hole at a lower end of the through hole;
a third step of filling the clearance and the through hole with a conductor to form a flange-shaped lower end electrode oad covering the lower end of the throuah hole and a columnar electrode filling the throuoh hole, said flange-shaped lower end electrode Dad and said columnar electrode being formed in the through hole of the subtrate;
a fourth step of removing the seed layar, and the adhesive layer from the substrate;
and, a step of laminating a resist layer on an upper face of the substrate and forming an opening wider than the cross section of the through hole at an upper end of the through hole in the resist layer; and
a step of filling the opening of the resist layer with a conductor to form an upper end electrode pad continuous to an upper end of the columnar electrode; and
a step of removing the resist layer surrounding the upper end electrode pad.

* * * * *